United States Patent
Hsu et al.

(10) Patent No.: US 8,835,908 B2
(45) Date of Patent: Sep. 16, 2014

(54) ORGANIC LIGHT-EMITTING DEVICE

(75) Inventors: Hsiang-Lun Hsu, Miaoli (TW);
Hsin-Yuan Su, Kaohsiung (TW)

(73) Assignee: Innolux Corporation, Miao-Li County (TW)

( * ) Notice: Subject to any disclaimer, the term of this patent is extended or adjusted under 35 U.S.C. 154(b) by 552 days.

(21) Appl. No.: 12/769,740

(22) Filed: Apr. 29, 2010

(65) Prior Publication Data
US 2010/0276677 A1 Nov. 4, 2010

(30) Foreign Application Priority Data
Apr. 29, 2009 (TW) ............................... 98114201 A

(51) Int. Cl.
*H01L 29/08* (2006.01)
*H01L 51/52* (2006.01)
(52) U.S. Cl.
CPC ......... *H01L 51/5275* (2013.01); *H01L 51/5237* (2013.01); *H01L 2251/5315* (2013.01)
USPC .................. 257/40; 257/82; 257/E39.007
(58) Field of Classification Search
USPC .............. 257/40, 89, E39.007, E51.022, 257/E51.018, E27.117–E27.119, 82, 257/94–103, E51.002, E27.118; 438/82, 99
See application file for complete search history.

(56) References Cited

U.S. PATENT DOCUMENTS

| | | | |
|---|---|---|---|
| 5,739,545 A | 4/1998 | Guha et al. | |
| 7,696,524 B2 * | 4/2010 | Ikeda et al. | 257/98 |
| 2006/0039152 A1 * | 2/2006 | Ito | 362/293 |
| 2006/0152150 A1 * | 7/2006 | Boerner et al. | 313/506 |
| 2006/0186802 A1 * | 8/2006 | Cok et al. | 313/506 |
| 2006/0202614 A1 * | 9/2006 | Li | 313/506 |
| 2007/0114520 A1 * | 5/2007 | Garditz et al. | 257/40 |
| 2007/0236140 A1 | 10/2007 | Hsu | |
| 2008/0169758 A1 * | 7/2008 | Cok | 313/506 |
| 2008/0265764 A1 * | 10/2008 | Kim et al. | 313/504 |
| 2008/0297036 A1 | 12/2008 | Noh et al. | |
| 2009/0284141 A1 * | 11/2009 | Sakanoue et al. | 313/504 |
| 2010/0001301 A1 * | 1/2010 | Karg et al. | 257/98 |

FOREIGN PATENT DOCUMENTS

CN 101051674 10/2007

OTHER PUBLICATIONS

Chinese language office action dated Jan. 30, 2014.
English language translation of abstract of CN 101051674 (published Oct. 10, 2007).

* cited by examiner

*Primary Examiner* — Cuong Q Nguyen
*Assistant Examiner* — Yosef Gebreyesus
(74) *Attorney, Agent, or Firm* — McClure, Qualey & Rodack, LLP

(57) ABSTRACT

Disclosed is an organic light-emitting device (OLED), wherein a lower electrode, an organic emitting unit, an upper electrode, and a light enhance layer are subsequently formed between a bottom substrate and a top substrate. The light enhance layer has higher refractive index, between 2 and 3, than that of the top substrates, thereby efficiently improving the luminance intensity of the OLED.

14 Claims, 5 Drawing Sheets

ORGANIC LIGHT-EMITTING DEVICE

CROSS REFERENCE TO RELATED APPLICATIONS

This Application claims priority of Taiwan Patent Application No. 98114201, filed on Apr. 29, 2009, the entirety of which is incorporated by reference herein.

BACKGROUND OF THE INVENTION

1. Field of the Invention

The present invention relates to an organic light-emitting device (OLED), and in particular relates to a structure for enhancing luminance intensity of an OLED.

2. Description of the Related Art

Organic light-emitting devices (OLED) have become popular due to advantages such as high brightness, light weight, thin structure, low power consumption, no backlight requirement, wide viewing angle, simple fabrication process, and fast response time.

However, to increase application of OLEDs, efficiently increasing luminance intensity of OLEDs is required. Thus, different combinations of the OLED layered structure and different compositions of the host material and the dopant in the light-emitting layer between the anode and/or the cathode of the OLEDs have been disclosed. Nevertheless, the results of the disclosed inventions only slightly, and not very efficiently, increase luminance intensity of OLEDs. Additionally, OLED properties such as operating lifespan, is often sacrificed for the slight increase in luminance intensity.

Accordingly, a method for enhancing luminance intensity of an OLED without drastically adjusting the present OLED structure is called for.

BRIEF SUMMARY OF THE INVENTION

The invention provides an organic light-emitting device, comprising: a bottom substrate; a bottom electrode on the bottom substrate; an organic light-emitting unit on the bottom electrode; a top electrode on the organic light-emitting unit; a light enhance layer on the top electrode; and a top substrate on the light enhance layer, wherein the light enhance layer has a higher refractive index than the top substrate, and the light enhance layer has a refractive index of 2 to 3.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
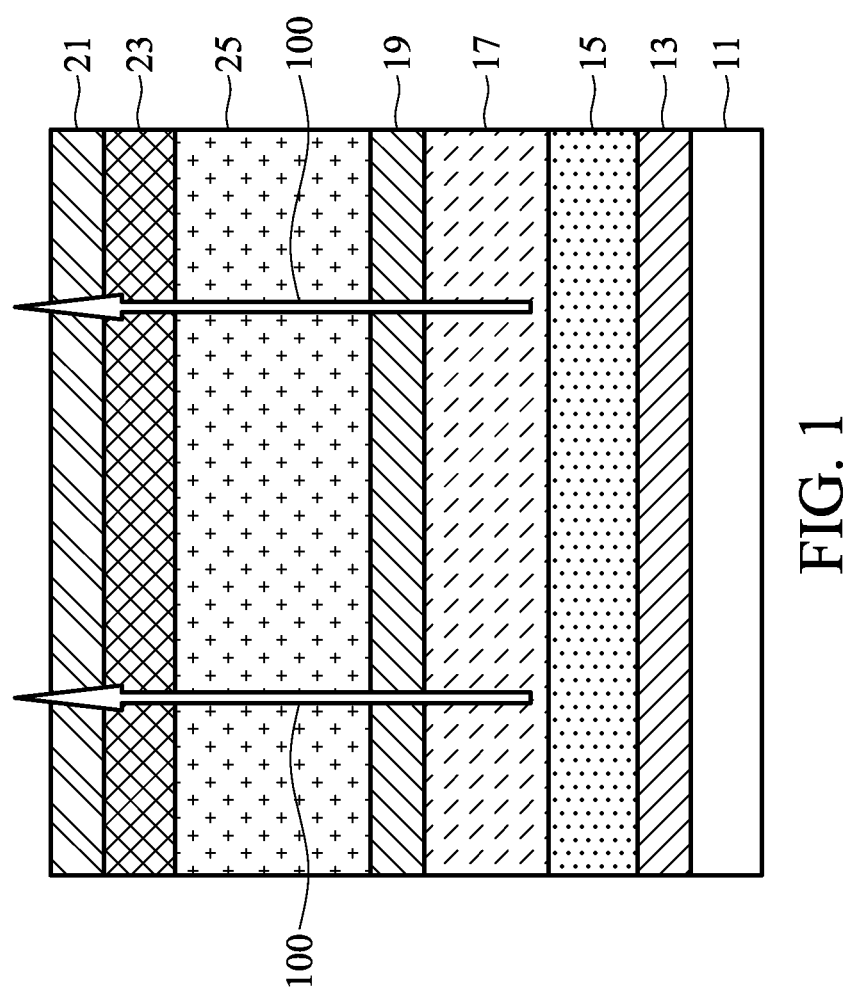
FIG. 1 is cross section of an OLED in one embodiment of the invention.

FIG. 1 shows an OLED in one embodiment of the invention. The suitable materials for the bottom substrate 11 in the invention include transparent glass or flexible plastic, or opaque material such as silicon substrate, silicon germanium substrate, silicon on insulator (SOI) substrate, and the likes.

Subsequently, the bottom electrode 13 is formed on the bottom substrate 11 by sputtering, physical vapor deposition (abbreviated PVD), and the likes. In one embodiment, the bottom electrode 13 may be reflective material such as Al, Ag, or alloys thereof. As such, the light emitted from the organic light-emitting unit will be reflected by the bottom electrode 13, and then pass through the top electrode. In another embodiment, the bottom electrode 13 is composed of transparent materials such as indium tin oxide (abbreviated ITO), indium zinc oxide (abbreviated IZO), aluminum zinc oxide (abbreviated AZO), and the likes. Therefore, an additional reflection layer (not shown) composed of Al, Ag, or alloys thereof is disposed between the bottom electrode 13 and the bottom substrate 11 to reflect the light emitted from the organic light-emitting unit.

The organic light-emitting unit 15 is then formed on the bottom electrode 13 by evaporation or spin-on coating. The organic light-emitting unit 15 of the invention may be a simple single light-emitting layer disposed between top and bottom electrodes, similar to prior art. Otherwise, a hole transport layer (HTL) may be disposed between the light-emitting layer and the anode, and a hole injection layer (HIL) may be disposed between the HTL and the anode. Furthermore, an electron transport layer (ETL) may be disposed between the light-emitting layer and the cathode, and an electron injection layer (EIL) may be disposed between the ETL and the cathode. It is understood that the top electrode may be an anode or cathode, and the bottom electrode would be the opposite electrode. In another embodiment, a hole block layer (HBL) is further disposed between the light-emitting layer and the ETL to enhance luminance efficiency. The light color emitted from the organic light-emitting unit is determined by the combination of the host material and the dopant in the light-emitting layer. In one embodiment, the host material in the light-emitting layer is metal complexes such as Tris(8-hydroxy quinoline) aluminum (III) (abbreviated Alq3), and the dopant thereof is organic materials including red dopants such as dicyanomethylene-2-tert-butyl-6-(1, 1,7,7-tetramethyljulolidin-4-yl-vinyl)-4H-pyran (abbreviated DCJTB), green dopants such as 10-(2-Benzothiazolyl)-2,3,6,7-tetrahydro-1,1,7,7-tetramethyl-1H,5H, 11H-(1)benzopyrano (6,7-8-I,j)quinolizin-11-one, (abbreviated C545T), or blue dopants such as 4,4'-bis(2,2'-diphenylvinyl)-1,1'-biphenyl (abbreviated DPVBi) or spiro-DPVBi. On the other hand, the host material of the light-emitting layer may be organic molecules including anthracene series such as 2-methyl-9,10-di(2-naphthyl)anthracene (abbreviated MADN) or carbazole series such as 4,4'-bis(carbazole-9-yl)-biphenyl (abbreviated CBP), N,N'-dicarbazolyl-3,5-benzene (abbreviated mCP), and Tris(carbazol-9-yl)benzene (abbreviated tCP). The corresponding dopant of the organic host material is a metal dopant including iridium complexes such as bis(1-phenylisoquinoline) acetylacetonate iridium (abbreviated PlQIr(acac)), bis(2-phenylquinolyl-N,C2) acetylacetonate iridium(III) (abbreviated PQIr(acac)), or bis(2-phenyl quinolyl-N,C2') acetylacetonate iridium(III) (abbreviated PQIr), or Pt complexes such as platinum octaethylporphine (abbreviated PtOEP). The iridium complex applied to emit green light may be tris[2-(2-pyridinyl)phenyl-C,N]-iridium (abbreviated Ir(ppy)₃). The red, green, and blue light-emitting layers of appropriate thickness may be sequentially stacked on the bottom electrode 13 to emit white light. The organic light-emitting unit 15 of different colors may define the red/green/blue pixels, and the pixels are driven by an active or passive circuit to complete a full color display device.

The described HIL includes copper phthalocyanine (abbreviated CuPc), 4,4',4''-Tris(N-3-methylphenyl-N-phenyl-amino)-triphenylamine (abbreviated MTDATA), and the likes. The described HTL includes N,N'-bis(naphthalen-1-yl)-N,N'-bis(phenyl)benzidine (abbreviated NPB), N,N'-di-1-naphthaleyl-N,N'-diphenyl-1,1'-biphenyl-4,4'-diamine (abbreviated NPD), N,N'-diphenyl-N,N'-di(3-methylphenyl)-1,1'-biphenyl-4,4'-diamine (abbreviated TPD), or poly (3,4-ethylenedioxythiophene) (abbreviated PEDOT). The described ETL includes bis(10-hydroxybenzo[h]quinolinato) beryllium (abbreviated BeBq2) or the likes, the EIL includes lithium doped BeBq2, and HBL includes 2,9-dimethyl-4,7-diphenyl 1,10-phenanthrolin (abbreviated BCP).

Subsequently, the top electrode is formed on the organic light-emitting unit 15 by PVD or sputtering. In one embodiment, the top electrode 17 is a transparent conductive oxide having a refractive index of less than 2, such as ITO, IZO, or AZO.

Subsequently, the protection layer 19 is formed on the top electrode 17 by chemical vapor deposition (abbreviated CVD). The protection layer 19 having a refractive index of less than 2 includes silicon oxide, silicon nitride, silicon oxynitride, or aluminum oxide. The protection layer 19 may be a single- or multi-layered structure to protect the top electrode 17, the organic light-emitting layer 15, and the bottom electrode 13, such that the illumination efficiency is free of moisture influence.

Subsequently, a transparent substrate such as glass or flexible plastic is provided as the top substrate 21, and the light enhance layer 23 is formed on the top substrate 21 by CVD. The light enhance layer 23 having a refractive index between 2 to 3 includes ZnS, ZnSe, NaCl, TiO₂, Nb₂O₅, MgO, TiO, or ZrO₂. In another embodiment, the light enhance layer 23 may be a dielectric layer such as silicon oxide, silicon nitride, silicon oxynitride, or aluminum oxide, having an element ratio and refractive index that is different from the dielectric material of the protection layer 19. For example, if silicon oxide is adopted to form the protection layer 19 and the light enhance layer 23, they are formed by different deposition factors. As such, the light enhance layer 23 having a refractive index of 2 to 3 and the protection layer 19 having a refractive index of less than 2 would have different silicon/oxygen ratio, respectively. If the light enhance layer 23 has a refractive index higher than 3, the light transmittance thereof will be largely decreased, thereby reducing luminance intensity. If the light enhance layer 23 has a refractive index of less than 2, the spectrum of the light would be significantly shifted.

At last, the light enhance layer 23 and the protection layer 19 are adhered by the organic insulation layer 25 to complete the structure as shown in FIG. 1. In one embodiment, the organic insulation layer 25 is a polymer such as epoxy resin or poly acrylic ester. The top and bottom substrates adhered by the organic insulation layer 25 prevent air from entering therein, which would reduce luminance intensity.

As shown in FIG. 1, the light 100 emitted from the organic light-emitting unit 15 of the OLED will pass through the bottom electrode 17, the protection layer 19, the organic insulation layer 25, the light enhance layer 23, and the top substrate 21. Compared to prior art, the light enhance layer 23 of the invention having high refractive index can efficiently improve luminance intensity of the OLED. Specifically, the light enhance layer 23 is disposed between the top substrate 21 and the organic insulation layer 25, thereby compensating for light loss due to the low refractive index of the organic insulation layer 25.

Figure 2:
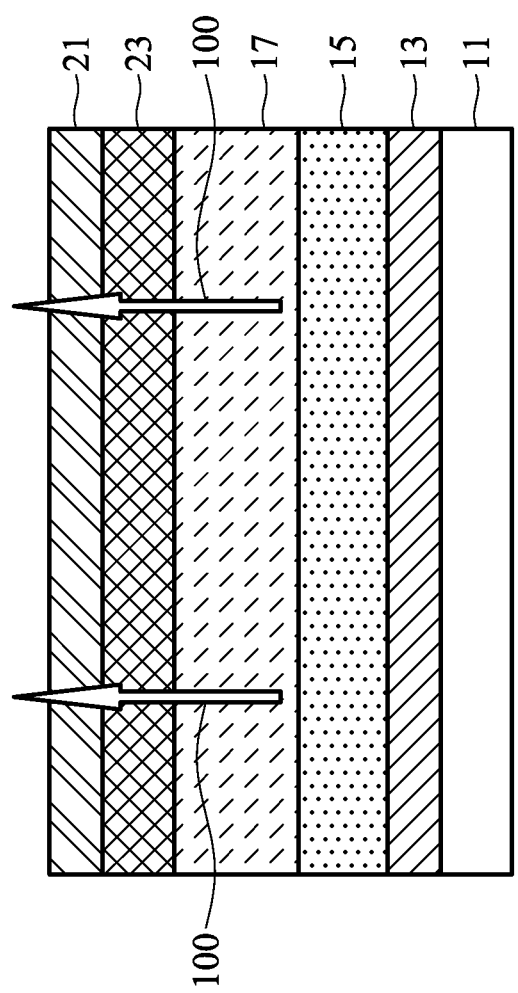
FIG. 2 is cross section of an OLED in one embodiment of the invention.

In one embodiment, the invention further provides another OLED as shown in FIG. 2. The bottom electrode 13, the organic light-emitting unit 15, and the top electrode 17 are sequentially formed on the bottom substrate 11, and the light enhance layer 23 is formed on the top substrate 21, wherein the material and fabrication method of the elements are similar to the previously described embodiment and omitted here. Thereafter, the top substrate 21 having the light enhance layer 23 is laminated to the top electrode 17 to complete the structure as shown in FIG. 2. Compared to the OLED in FIG. 1, this embodiment is free of the protection layer 19 and the organic insulation layer 25. Because the light enhance layer 23 has a higher refractive index, between 2 to 3, than the top substrate 21, it still efficiently improves luminance intensity.

Figure 3:
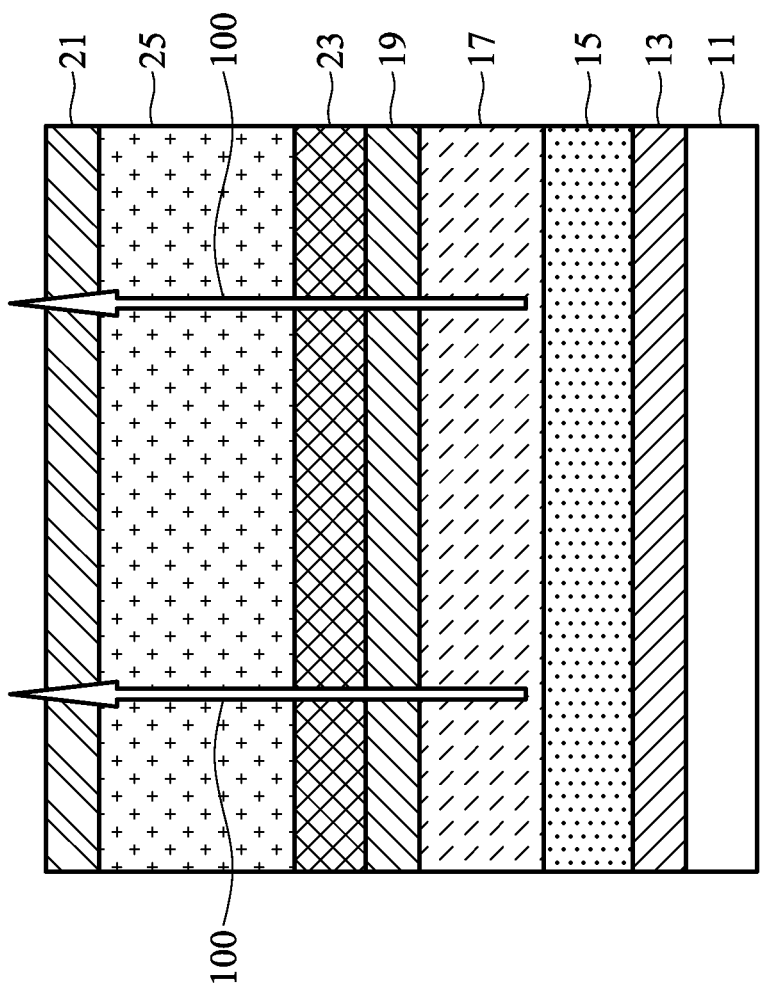
FIG. 3 is cross section of an OLED in one embodiment of the invention.

In one embodiment, the invention further provides another OLED as shown in FIG. 3. The bottom electrode 13, the organic light-emitting unit 15, the top electrode 17, the protection layer 19, and the light enhance layer 25 are sequentially formed on the bottom substrate 11, wherein the material and fabrication method of the elements are similar to the previously described embodiments and omitted here. Thereafter, the top substrate 21 is adhered to the light enhance layer 23 by the organic insulation layer 25 to complete the structure as shown in FIG. 3. Compared to the OLED in FIG. 1, the light enhance layer 23 and the organic insulation layer 25 are interchanged in this embodiment. This embodiment not only efficiently improves luminance intensity but also increases process flexibility.

The light enhance layer 23 of the invention, has a thickness T as shown in Formula 1 when the organic light-emitting unit emits a blue light of 450 nm to 480 nm:

$$T=(55-20\times(n-2.1))+(110-50\times(n-2.1))\times m \quad \text{(Formula 1)}.$$

In Formula 1, T is the thickness (nm) of the light enhance layer, n is the refractive index of the light enhance layer, m is the variation of the experimental curve simulation, and $0<m\leq 100$.

In addition, the light enhance layer 23 has a thickness T as shown in Formula 2 when the organic light-emitting unit emits a green light of 510 nm to 540 nm:

$$T=(65-20\times(n-2.1))+(125-50\times(n-2.1))\times m \quad \text{(Formula 2)}.$$

In Formula 2, T is the thickness (nm) of the light enhance layer, n is the refractive index of the light enhance layer, m is the variation of the experimental curve simulation, and $0<m\leq 100$.

The light enhance layer 23 has a thickness T as shown in Formula 3 when the organic light-emitting unit emits a red light of 590 nm to 630 nm:

$$T=(25=20\times(n-2.1))+(100+60\times(n-21))\times m \quad \text{(Formula 3)}.$$

In Formula 3, T is the thickness (nm) of the light enhance layer, n is the refractive index of the light enhance layer, m is the variation of the experimental curve simulation, and $0<m\leq 100$.

The light enhance layer 23 has a thickness T as shown in Formula 4 when the organic light-emitting unit emits a white light of 440 nm to 660 nm:

$$T=100\times m+(130-100\times(n-2.1))\times X \quad \text{(Formula 4)}.$$

In Formula 4, T is the thickness (nm) of the light enhance layer, n is the refractive index of the light enhance layer, m and X are the variations of the experimental curve simulation, $0 < m \leq 10$, and $0 < X \leq 100$.

EXAMPLES

Example 1

Referring to FIG. 1, the elements of the OLED had thickness and composition as below:
Bottom substrate 11: glass substrate of 0.6 mm;
Bottom electrode (andoe) 13: Ag of 100 nm;
Organic light-emitting unit 15:
    HIL: mTDATA of 600 Å;
    HTL: NPB of 200 Å;
    Light-emitting layer: See Table 1;
    ETL: BeBq2 of 300 Å; and
    EIL: 2% Li doped BeBq2 of 100 Å:
Top electrode (cathode) 17: ITO;
Protection layer 19: SiN of 400 nm (refractive index was 1.9);
Organic insulation layer 25: ETP 101 of 6 μm (commercially available from Sekisui chemical Co., Ltd);
Light enhance layer 23: ZnSe of 150 nm;
Top substrate 21: glass substrate of 0.5 mm; and
voltage: 6V.

TABLE 1

| Light color | Light-emitting layer composition |
| --- | --- |
| Red | Alq3 doped with 0.5% DCJTB, totally 200 Å. |
| Green | Alq3 doped with 1% C545T, totally 200 Å. |
| Blue | MADN doped with 2% DPVBi, totally 200 Å. |
| White | Stacked structure of Alq3 doped with 0.5% DCJTB (50 Å)/ MADN doped with 2% DPVBi (150 Å)/Alq3 doped with 1% C545T (50 Å) |

Comparative Example 1

Figure 4:
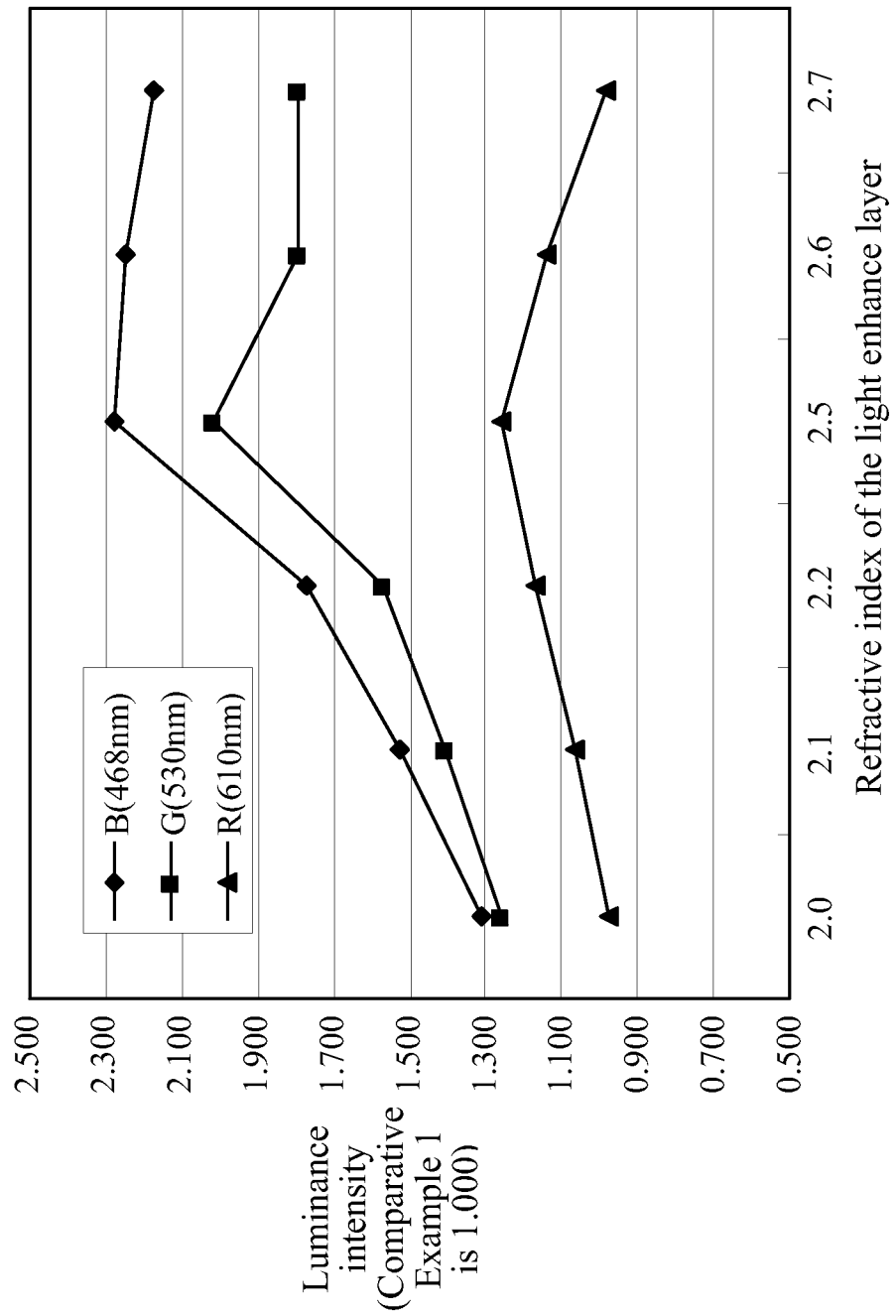
FIG. 4 is a schematic view showing the luminance intensity comparison of an Example and Comparative Example.
Figure 5:
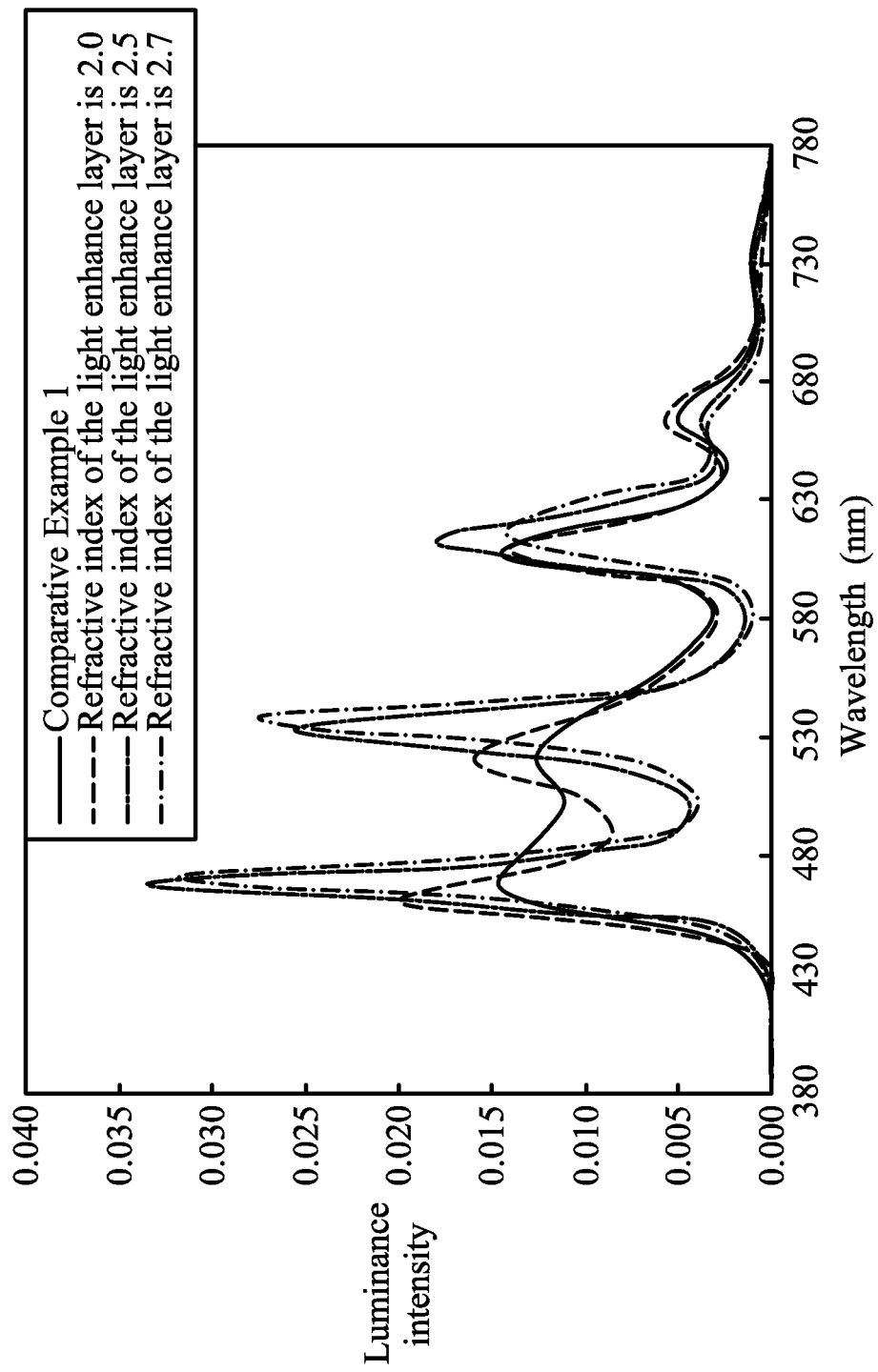
FIG. 5 is a schematic view showing the luminance intensity comparison of an Example and Comparative Example.

The difference between Comparative Example 1 and Example 1 was elimination of the light enhance layer 23 for the Comparative Example 1. The luminance intensity of the OLED in the Comparative Example 1 was utilized as a standard (100%), and the luminance intensity of Example 1 with light enhance layers 23 having high refractive indexes of 2.0 to 2.7 was recorded as shown in FIGS. 4 and 5. FIG. 4 shows the light enhance effect of the red/green/blue OLED applying the light enhance layers 23 of different refractive indexes. FIG. 5 shows the light enhance effect of the white OLED applying light enhance layers 23 of different refractive indexes. Referring to FIGS. 4 and 5, the light enhance layer 23 of the invention efficiently improves the luminance intensity of the OLED.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. An organic light-emitting device, comprising:
a bottom substrate;
a bottom electrode on the bottom substrate;
an organic light-emitting unit on the bottom electrode, wherein the organic light-emitting unit emits a white light;
a top electrode on the organic light-emitting unit;
a light enhance layer on the top electrode; and
a top substrate on the light enhance layer,
wherein the light enhance layer has a higher refractive index than the top substrate, and the light enhance layer has a refractive index of 2 to 3,
wherein the light enhance layer comprises a continuous layered material of ZnS, ZnSe, NaCl, $TiO_2$, $Nb_2O_5$, MgO, TiO, or $ZrO_2$.

2. The device as claimed in claim 1, wherein the bottom electrode is a transparent material, and the device further comprising a reflection layer disposed between the bottom electrode and the bottom substrate.

3. The device as claimed in claim 2, wherein the bottom electrode comprises indium tin oxide, indium zinc oxide, or aluminum zinc oxide.

4. The device as claimed in claim 2, wherein the reflection layer comprises Ag, Al, or alloys thereof.

5. The device as claimed in claim 1, wherein the bottom electrode is a reflective material comprising Ag, Al, or alloys thereof.

6. The device as claimed in claim 1, wherein the top electrode comprises indium tin oxide, indium zinc oxide, or aluminum zinc oxide.

7. The device as claimed in claim 1, further comprising:
a protection layer on the top electrode; and
an organic insulation layer disposed between the protection layer and the light enhance layer,
wherein the light enhance layer has a higher refractive index than the protection layer.

8. The device as claimed in claim 7, wherein the protection layer has a refractive index of less than 2.

9. The device as claimed in claim 7, wherein the protection layer comprises silicon oxide, silicon nitride, silicon oxynitrdie, or aluminum oxide.

10. The device as claimed in claim 7, wherein the organic insulation layer comprises epoxy resin or poly acrylic ester.

11. The device as claimed in claim 1, further comprising:
a protection layer disposed between the top electrode and the light enhance layer; and
an organic insulation layer disposed between the light enhance layer and the top substrate,
wherein the light enhance layer has a greater refractive index than that of the protection layer.

12. The device as claimed in claim 1, wherein the organic light-emitting unit emits a white light having a wave length of 440 nm to 660 nm, and the light enhance layer has a thickness defined as below:

$$T = 100 \times m + (130 - 100 \times (n - 2.1)) \times X;$$

wherein T is the thickness (nm) of the light enhance layer;
n is the refractive index of the light enhance layer;
$0 < m \leq 10$; and
$0 < X \leq 100$.

13. The device as claimed in claim 1, wherein the light-emitting unit comprises a hole injection layer, a hole transport layer, a light-emitting layer, an electron transport layer, and an electron injection layer.

14. The device as claimed in claim 1, wherein the light enhance layer is single-layered.

* * * * *